(12) United States Patent
Yang et al.

(10) Patent No.: US 11,587,927 B2
(45) Date of Patent: Feb. 21, 2023

(54) CROWN BULK FOR FINFET DEVICE

(71) Applicant: Taiwan Semiconductor Manufacturing Co., Ltd., Hsin-Chu (TW)

(72) Inventors: Chih-Chuan Yang, Hsinchu (TW); Yu-Kuan Lin, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/827,315

(22) Filed: Mar. 23, 2020

(65) Prior Publication Data

US 2021/0098454 A1 Apr. 1, 2021

Related U.S. Application Data

(60) Provisional application No. 62/907,258, filed on Sep. 27, 2019.

(51) Int. Cl.
| | |
|---|---|
| *H01L 27/092* | (2006.01) |
| *H01L 21/8238* | (2006.01) |
| *H01L 29/08* | (2006.01) |
| *H01L 29/10* | (2006.01) |
| *H01L 21/308* | (2006.01) |
| *H01L 29/66* | (2006.01) |
| *H01L 21/3065* | (2006.01) |

(52) U.S. Cl.
CPC ........ *H01L 27/0921* (2013.01); *H01L 21/308* (2013.01); *H01L 21/3065* (2013.01); *H01L 21/823821* (2013.01); *H01L 21/823892* (2013.01); *H01L 27/0922* (2013.01); *H01L 29/0847* (2013.01); *H01L 29/1083* (2013.01); *H01L 29/66537* (2013.01)

(58) Field of Classification Search
CPC ............ H01L 27/0924; H01L 27/0921; H01L 21/823821; H01L 21/823892
See application file for complete search history.

(56) References Cited

U.S. PATENT DOCUMENTS

| | | | |
|---|---|---|---|
| 8,110,466 B2 * | 2/2012 | Shieh | H01L 21/823431 438/268 |
| 8,497,171 B1 * | 7/2013 | Wu | H01L 21/823821 438/218 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,275,905 B1 * | 3/2016 | Wen | H01L 21/823807 |
| 9,520,482 B1 | 12/2016 | Chang et al. | |

(Continued)

*Primary Examiner* — Michael M Trinh
(74) *Attorney, Agent, or Firm* — Haynes and Boone, LLP

(57) ABSTRACT

A device includes a semiconductor substrate having a first region and a second region. The device further includes a first pair of fin structures within the first region. The device further includes a second pair of fin structures within the second region. A top surface of the semiconductor surface between fin structures within the first pair is higher than a top surface of the semiconductor surface between the first pair and the second pair.

20 Claims, 8 Drawing Sheets

(56) References Cited

U.S. PATENT DOCUMENTS

| | | |
|---|---|---|
| 9,576,814 B2 | 2/2017 | Wu et al. |
| 2015/0372144 A1* | 12/2015 | Fang ............... H01L 21/823821 257/192 |
| 2016/0155670 A1* | 6/2016 | Liaw .................... H01L 21/845 257/401 |
| 2016/0225906 A1* | 8/2016 | Wang .................... H01L 29/785 |
| 2018/0040614 A1* | 2/2018 | Chang ................. H01L 29/0847 |
| 2019/0067419 A1* | 2/2019 | Zhou ............... H01L 21/823807 |
| 2019/0280086 A1* | 9/2019 | Karp ............... H01L 21/823878 |
| 2020/0013776 A1* | 1/2020 | Liaw .................. H01L 29/1095 |

* cited by examiner

CROWN BULK FOR FINFET DEVICE

PRIORITY DATA

This is a utility application claiming the benefit of U.S. Patent Provisional Application No. 62/907,258 filed Sep. 27, 2019, entitled "Crown Bulk in FinFET Structure for Isolation and Latch Up Improvement", the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
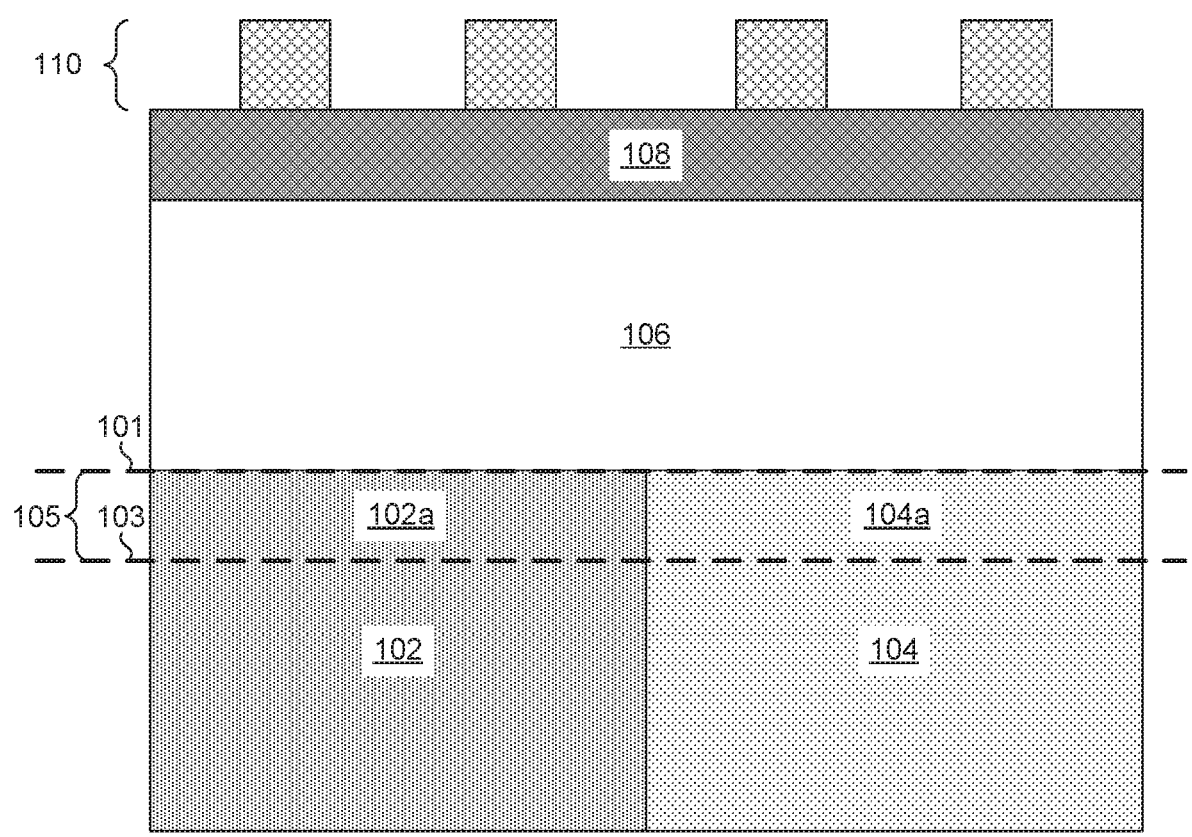
FIGS. 1A, 1B, 1C, 1D, 1E, and 1F illustrate a process for fabricating finFET structures with a crown bulk, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to methods of fabricating field-effect transistors (FETs), such as fin-like FETs (FinFETs). A finFET transistor typically includes a fin-like semiconductor structure formed on a substrate. The substrate and the bottom portion of the fin-like structure may be doped to form a doped well. For example, for an NMOS transistor, a p-well may be formed within the lower portion of the fin structure. For a PMOS transistor, an n-well may be formed in the lower portion of the fin structure.

Transistors are used to form complex logic circuits within integrated circuits. For these circuits, p-type (PMOS) transistors may be placed adjacent to n-type (NMOS) transistors. More specifically, a set of two or more PMOS transistors may be placed near a set of two or more NMOS transistors. In some circumstances, current may leak from the PMOS transistor, through the n-well, through the p-well, and to the NMOS transistor. This can cause a variety of issues such as latch-up. Latch-up is a type of short circuit that can occur in an integrated circuit. It involves the inadvertent creation of a low-impedance path through the integrated circuit. This triggers a parasitic structure which disrupts proper functioning of the circuit. Latch-up may result from two different types of transistors placed next to each other, i.e., a PMOS next to an NMOS transistor. This forms a PNPN structure. Due to the finFET structure, particularly as fin widths become smaller, the dopant under the channel might be lost during a latch-up. Device leakage from subthreshold channel might also increase due to anti-punch through dopant being lost.

According to principles described herein, a semiconductor device includes a first structure and a second structure. The first structure may be, for example, a pair of NMOS fin structures. The second structure may be, for example, a pair of PMOS fin structures. The top surface of the semiconductor bulk between the pair of fin structures of the first structure is higher than the top surface of the semiconductor structure between the first and second structures. Similarly, the top surface of the semiconductor bulk between the pair of fin structures of the second structure is higher than the top surface of the semiconductor structure between the first and second structures. This increases the physical distance through the semiconductor bulk between the NMOS and PMOS devices of the first and second structures. This reduces the potential current path between the two and reduces the chances that a parasitic structure associated with latch-up will occur.

FIGS. 1A, 1B, 1C, 1D, 1E, and 1F illustrate a process for fabricating finFET structures with a crown bulk. FIG. 1A illustrates a substrate with a number of layers, including the well layers 102, 104, a semiconductor layer 106, a hardmask layer 108, and a patterned resist layer 110. The well layers 102, 104 may be doped portions of a semiconductor substrate. For example, the substrate may be a silicon substrate. The semiconductor substrate may be part of a silicon wafer. Other semiconductor materials are contemplated. The substrate may have a first region 102 and a second region 104. The first region 102 may be, for example, an n-well. The second region 104 may be, for example, a p-well. An n-well is doped with an n-type dopant and the p-well is doped with a p-type dopant. Various dopant processes may be used such as implanting processes. In one example, the first region 102 may be covered with a resist material while the second region is doped. Additionally, the second region 104 may be covered with a resist material while the first region 102 is doped.

In both regions 102, 104, the upper portions 102a, 104a may be doped with a higher doping concentration to form an anti-punch-through layer. The anti-punch-through layers 102a, 104a may extend from the top surface of the well regions 102, 104 at line 101 to line 103. The thickness 105 of the anti-punch-through layers 102a, 104a may be about 15-25 nanometers. Other sizes are contemplated. The anti-punch-through layers 102a, 104a are directly beneath the channel regions which will be formed within the semiconductor layer 106.

Anti-punch-through layers 102a, 104a provide various benefits. As transistors are formed with smaller sizes, the channels of such devices also become smaller. Smaller channels may present a variety of issues, which are often referred to as the short channel effect. For example, a short channel may allow for current to inadvertently flow between the source and the drain based on voltage differential between the source and drain. To avoid this issue, anti-punch-through features 102a, 104a can be formed at or near the bottom of a channel.

To form the anti-punch-through layers in the n-well region 102, an implanting process can be used. The implanting process can be tuned such that the anti-punch-through features are formed at a particular depth below the surface of the n-well 102. In one example, the anti-punch-through features 102a are formed at a depth such that a bottom of the anti-punch-through features 102a are at about 15-25 nanometers below the surface. This can be done by adjusting the electric field used in the ion implanting process. Ion implantation utilizes an electric field to accelerate ions towards a surface. By setting the strength of the electric field appropriately, the ions can lodge near a specific point below the surface. The implanting process implants a n-type dopant but at a higher concentration than the rest of the features 102, which are already doped with an n-type dopant. The implanting process is such that the anti-punch-through layer is at a substantially uniform depth. In some examples, a Rapid Thermal Annealing (RTA) process is performed after the implanting process. An RTA process involves exposing the substrate to high temperatures.

To form the anti-punch-through layers in the p-well region 104, an implanting process can be used. The implanting process can be tuned such that the anti-punch-through features are formed at a particular depth below the surface of the p-well 104. In one example, the anti-punch-through features 104a are formed at a depth such that a bottom of the anti-punch-through features 104a are at about 15-25 nanometers below the surface. The implanting process implants a p-type dopant but at a higher concentration than the rest of the features 104, which are already doped with a p-type dopant. The implanting process is such that the anti-punch-through layer 104a is at a substantially uniform depth. In some examples, a Rapid Thermal Annealing (RTA) process is performed after the implanting process. An RTA process involves exposing the substrate to high temperatures.

The semiconductor layer 106 may be formed through an epitaxial growth process. The epitaxial growth process is used to form crystal structures on underlying crystal structures. In this case, the semiconductor layer 106 is grown onto the doped well regions 102, 104. The semiconductor layer 106 may be, for example, a silicon layer. Other semiconductor materials may be used as well. In some examples, the top 10 angstroms of the silicon layer may be formed in a separate epitaxial process. In other words, the first portion of the semiconductor layer 106 may be formed in a first epitaxial process, and the last 10 angstroms of the semiconductor layer 106 may be formed in a second, separate epitaxial process. This may be done to help control etching during subsequent steps.

The hardmask layer 108 is deposited on the semiconductor layer 106. The hardmask layer 108 is used to pattern the semiconductor layer 106 and the well layers 102, 104 to form fin structures. The hardmask layer 108 may include at least one of silicon oxide ($SiO2$), silicon nitride (SiN), silicon carbide (SiC), silicon oxynitride (SiON), silicon oxycarbide (SiOCN), hafnium oxide ($HfO2$), aluminum oxide ($Al_2O_3$), and zirconium oxide ($ZrO2$). Other materials are contemplated. In some examples, the hardmask layer 108 may include several sublayers. For example, the hardmask layer may include a first oxide layer approximately 25 angstroms thick. In some examples, the first oxide layer may be within a range of about 20-30 angstroms thick. On top of that, there may be a silicon nitride layer approximately 260 angstroms thick (or within a range of about 220-300 angstroms thick). On top of that, there may be another oxide layer approximately 450 angstroms thick (or within a range of about 400-500 angstroms thick).

A photoresist 110 may be placed on top of the hardmask layer 108. The photoresist 110 may be used to photolithographically pattern the hardmask layer 108. For example, the photoresist 110 may be exposed to a light source through a photomask. The photoresist may then be developed such that the portions of the photoresist other than where fin structures are to be formed are removed.

Figure 1B:
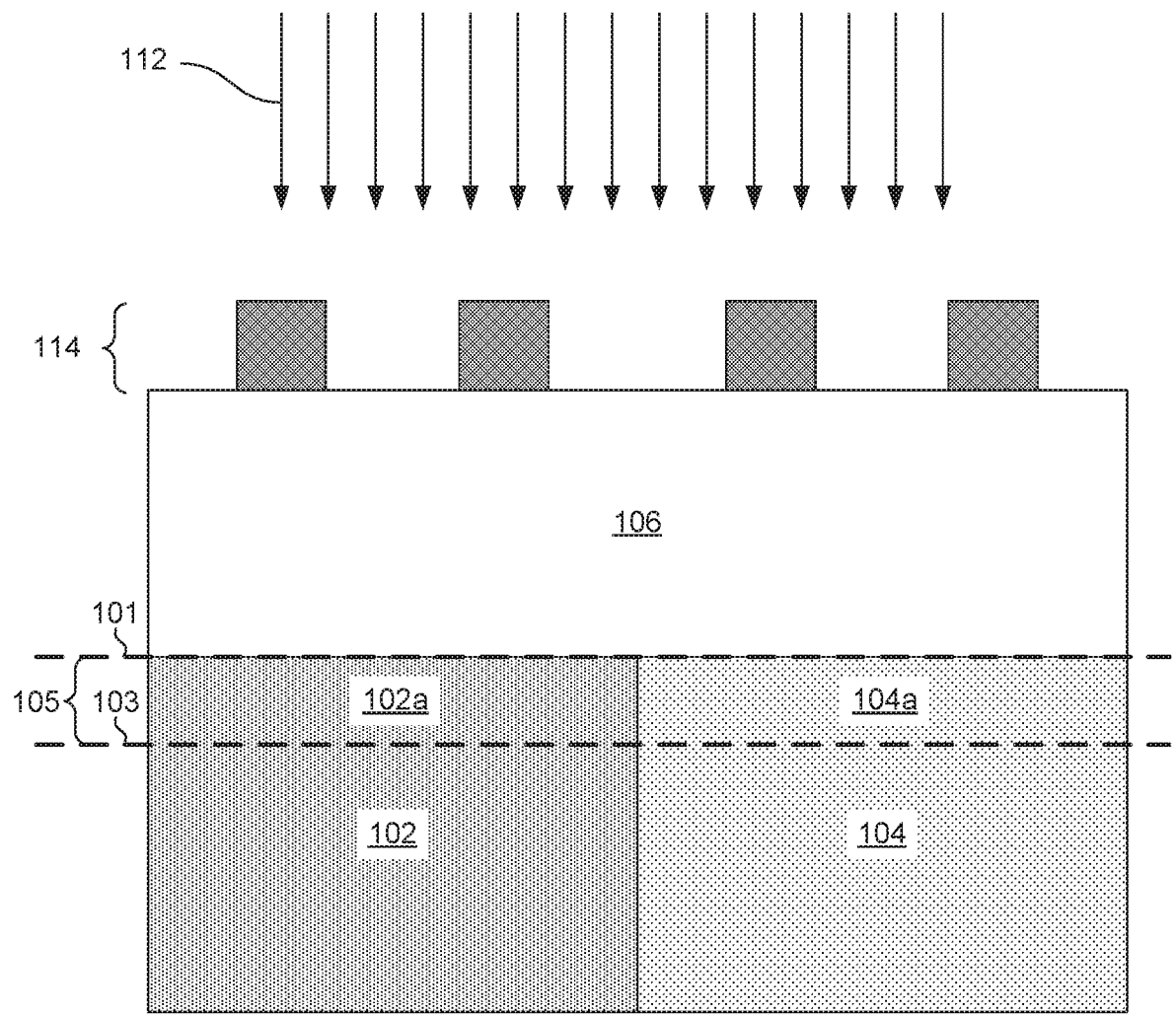

FIG. 1B illustrates a patterning process 112 in which the hardmask layer 108 is patterned to form a patterned hardmask layer 114. The patterning process 112 may include exposing and developing the photoresist, and then etching the hard mask through the patterned photoresist. This will transfer the pattern of the photoresist to the hardmask layer 108 to form the patterned hardmask layer 114. The patterned hardmask layer 114 includes a number of features that correspond to locations at which fin structures are to be formed. After the patterned hardmask layer 114 is formed, the semiconductor layer 106 is ready for etching.

Figure 1C:
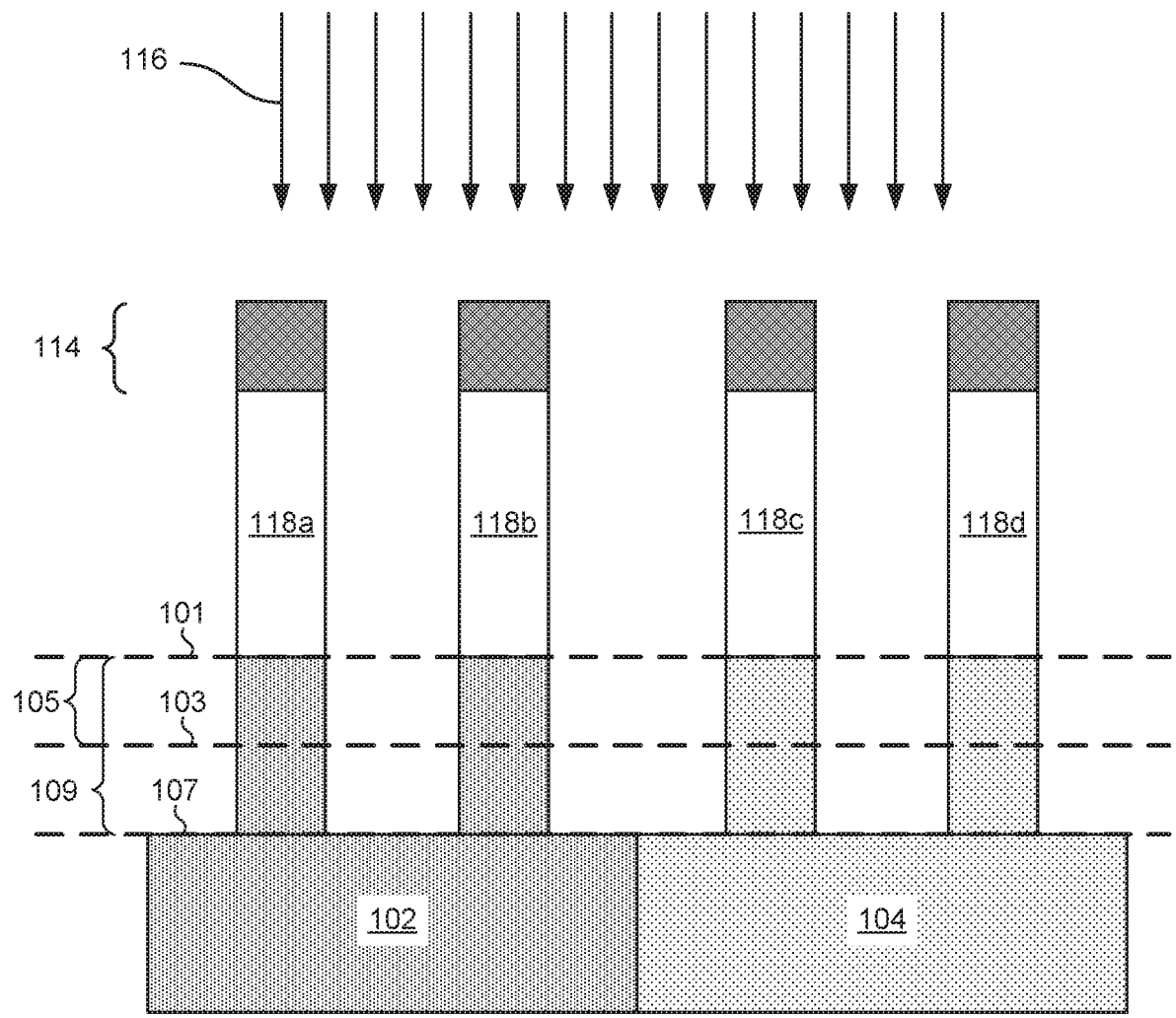

FIG. 1C illustrates an etching process 116. The etching process 116 may be an anisotropic etching process such as a dry etching process. The etching process 116 transfers the pattern of the patterned hardmask layer 114 to the semiconductor layer 106 and the well regions 102, 104. Thus, the etching process 116 forms a pair of fin structures 118a, 118b in the n-well region 102 and forms a pair of fin structures 118c, 118d in the p-well region 104.

The etching process etches fully through the semiconductor layer 106 and partially through the well regions 102, 104, The etching process 116 may be controlled to etch the well regions to a depth 107 that is twice the depth of the anti-punch-through layers 102a, 104a. In some examples, the etching process 116 may etch to a depth 109 of about 40 nanometers.

The etching process 116 may be a dry etching process. Dry etching processes remove material by exposing the material to a bombardment of ions. This is done using plasma of reactive gases such as oxygen or chlorine with the addition of nitrogen or argon. The ions thus dislodge portions of the material from the exposed regions. Dry etching processes are generally anisotropic, which means that they etch primarily in one direction.

Figure 1D:
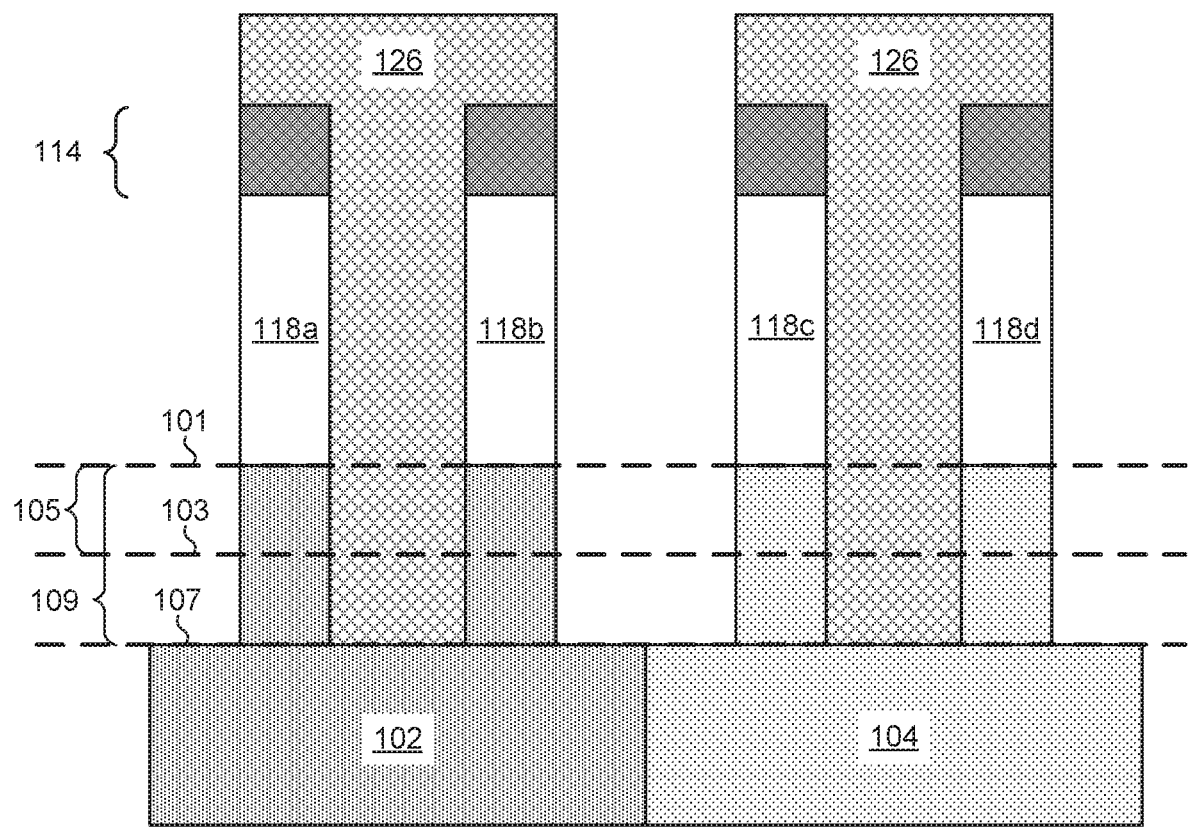

FIG. 1D illustrates the formation of a patterned photoresist 126 on the workpiece. Specifically, a photoresist layer may be initially placed on the workpiece through a spin coating process. After the spin coating process, the photoresist layer exists as a single, continuous layer across the semiconductor wafer. Then, the photoresist layer is exposed to a light source through a photomask. After the exposure, the photoresist is developed. After development, the photoresist layer becomes the patterned photoresist layer 126. The patterned photoresist layer covers the space between fin structure 118a and 118b as well as the space between fin structure 118c and 118d. However, the space outside those fin structures is exposed, as shown in FIG. 1D.

Figure 1E:
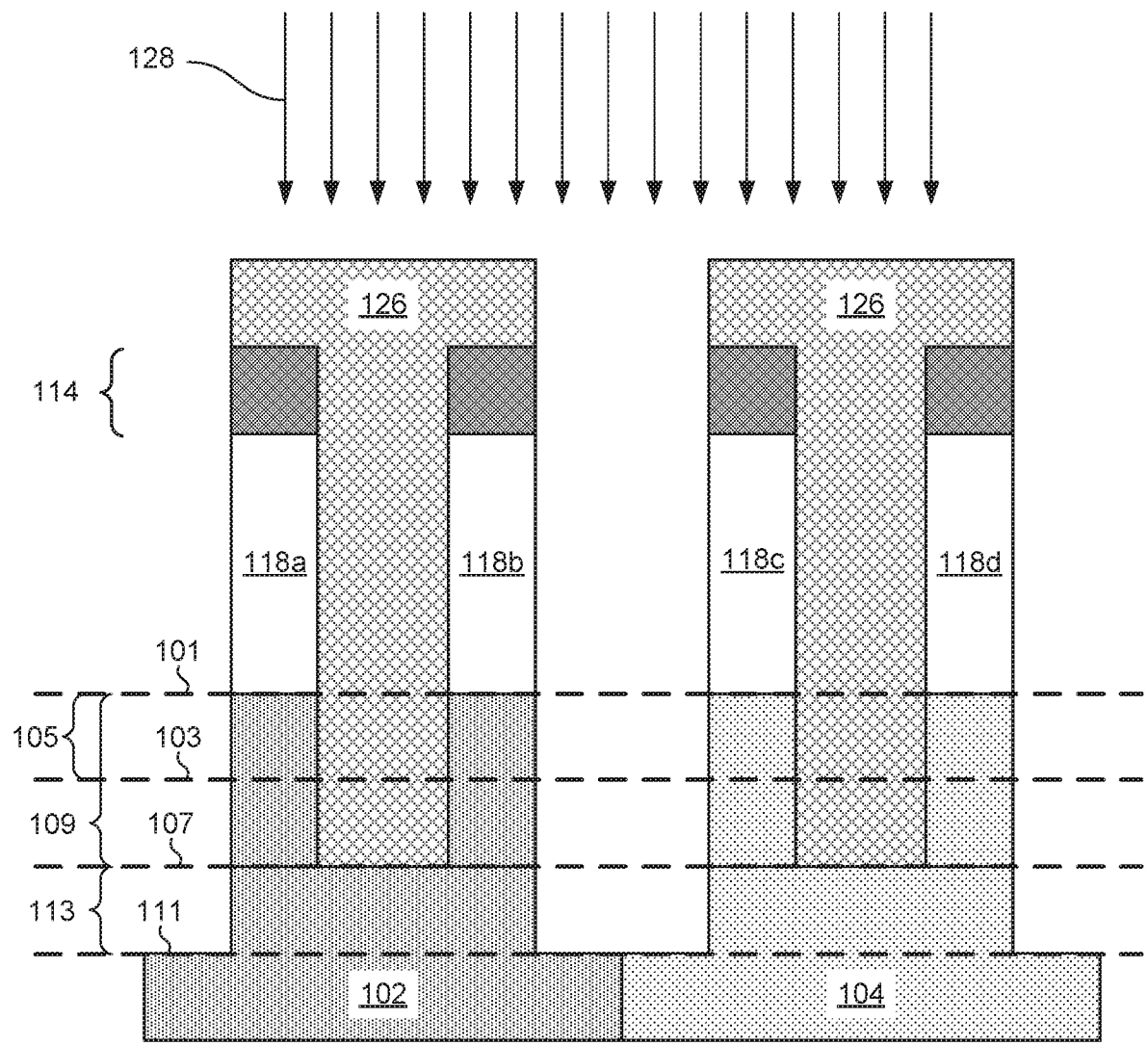

FIG. 1E illustrates a second etching process 128 to further etch the n-well 102 and p-well 104 regions. This etching process 128 may be, for example, an anisotropic process such as a dry etching process. The etching process 128 may remove n-well 102 and p-well 104 regions to a particular depth at line 111. The etching process 128 may remove approximately half as much of the n-well and p-well regions as the previous etching process 116 removed. For example, the etching process 128 may remove approximately 15-25 nanometers worth of material. Thus, the distance 113 between line 111 and line 107 may be approximately 15-25 nanometers.

The etching process 128 may be a dry etching process. Dry etching processes remove material by exposing the material to a bombardment of ions. This is done using plasma of reactive gases such as oxygen or chlorine with the addition of nitrogen or argon. The ions thus dislodge portions of the material from the exposed regions. Dry etching processes are generally anisotropic, which means that they etch primarily in one direction.

Figure 1F:
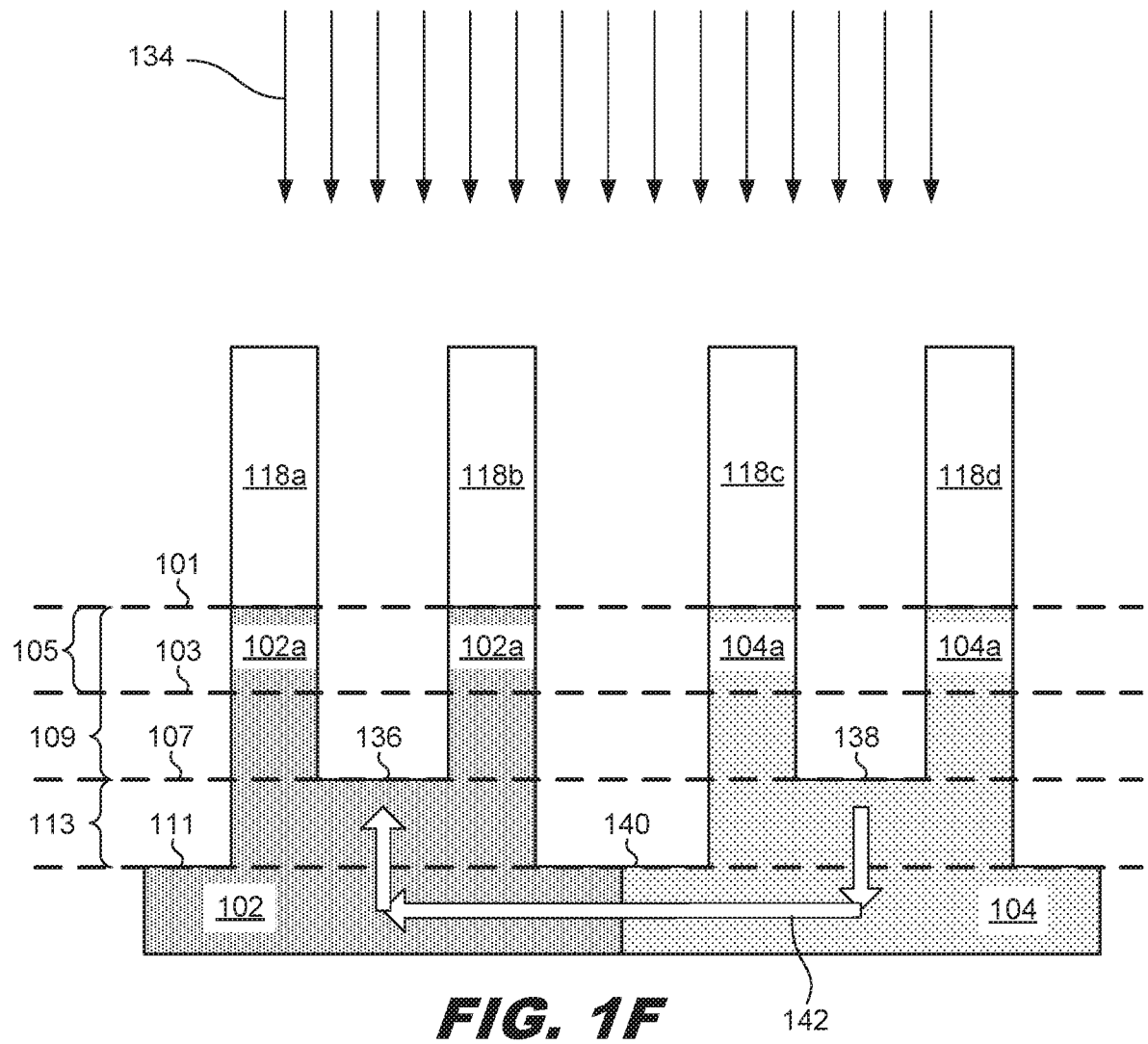

FIG. 1F illustrates a removal process 134 to remove the patterned photoresist layer 126. After the patterned photoresist layer 126 is removed, subsequent fabrication steps may be performed to build the transistor on the fin structure. Specifically, a dummy gate may be formed over the fin structures in both the n-well and p-well regions. Source/drain regions may then be formed within the fin structure on both sides of the dummy gate. The dummy gate may then be replaced with a metal gate. In some examples, an isolation structure may be formed around the fin structures. The isolation structure may include, for example, an Interlayer Dielectric Layer (ILD) or a Shallow Trench Isolation (STI) structure. Either the ILD or the STI may include a low-k dielectric material. For example, the isolation structure may include one of silicon nitride (SiN), silicon carbon nitride (SiCN), or silicon oxycarbide (SiOCN). Other materials may be used as well.

Using the techniques described herein, the top surface 136 of the n-well region 102 between the pair of fin structures 118a, 118b is higher than the top surface 140 between the two pairs of fin structures. Similarly, the top surface 138 of the p-well region 104 between the pair of fin structures 118c, 118d is higher than the top surface 140 between the two pairs of fin structures. This increases the path 142 between the two surfaces 136, 138 and thus reduces the change of leakage current and latch-up.

Figure 2:
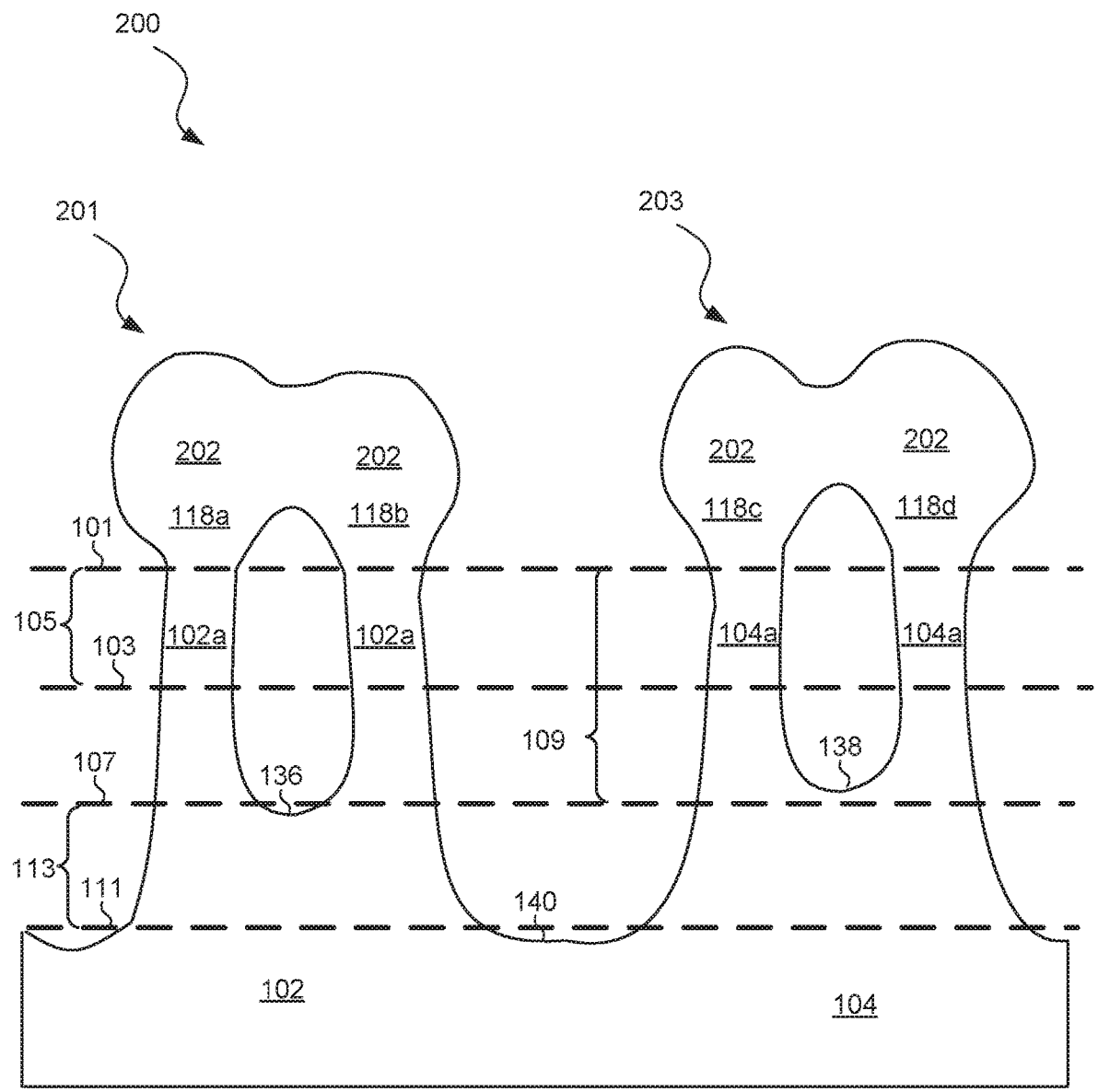
FIG. 2 is a diagram showing an illustrative image of finFET structures with a crown bulk, according to one example of principles described herein.

FIG. 2 is a diagram showing an illustrative image of finFET structures with a crown bulk. FIG. 2 illustrates a diagram that more closely resembles the actual shape of the devices described herein. FIG. 2 also illustrates the source/drain features 202 formed within the fin structures 118a, 118b, 118c, 118d. Specifically, line 101 represents the boundary between the channel/source/drain portion of the fin structures 118a, 118b, 118c, 118d and the top ends of the n-well 102 and p-well 104 region. At the top ends of the n-well and p-well regions 102, 104 is the anti-punch-through layer 102a, 104a, which has a higher concentration of dopant than the lower portions of the fin structures 118a, 118b, 118c, 118d. The anti-punch-through layer 102a, 104a extends down to approximately line 103. The thickness 105 of the anti-punch-through layers 102a, 104a may be approximately 15-25 nanometers. At line 107 is the top surfaces 136, 138 of the bulk semiconductor substrate. Line 107 may be about twice the depth as line 103. In some examples, line 107 may be at a depth 109 of about 40 nanometers. The distance 113 between the top surfaces 136, 138 and the top surface 140 between the two pairs of fin structures may be about ⅓ or 33% of the distance between line 111 and line 101. Said differently, the distance 113 divided by (distance 113 plus distance 109) is approximately 0.33. The ratios described herein are approximate and may vary within a range of about 0-15% from the stated distances and/or ratios.

As a result of the processes described with the text accompanying FIGS. 1A-1F, a semiconductor device 200 is formed. The semiconductor device 200 includes a first structure 201 and a second structure 203. The first structure 201 may be, for example, a pair of NMOS finFET transistors. FIG. 2 illustrates a cut along the source/drain features 202 and thus does not show the gate structure associated with the NMOS transistors. The first structure includes two fin structures 118a, 118b. The bottom portions of the fin structures, which correspond to the well region 102, are doped with an n-type dopant. The upper ends of the bottom portions include an anti-punch-through layer 102a. The anti-punch-through layer 102a has a higher doping concentration than the lower portions of the n-well 102 (i.e., below line 103). The first structure also includes a top surface 136 extending between fin structure 118a and 118b.

The second structure 203 includes two fin structures 118c, 118d. The bottom portions of the fin structures, which correspond to the well region 104, are doped with a p-type dopant. The upper ends of the bottom portions include an anti-punch-through layer 104a. The anti-punch-through layer 104a has a higher doping concentration than the lower portions of the p-well 104 (i.e., below line 103). The second structure 203 also includes a top surface 138 extending between fin structure 118c and 118d. The surfaces 136 and 138 are higher than the surface 140 that extends between the first structure 201 and the second structure 203.

The ratios described above provide various advantages and benefits. Specifically, as mentioned above, having the higher surfaces 136, 138 between fin structures than the surface 140 between the pairs of fin structures increases the distance between the surfaces 136,138 and reduces the chance of a latch-up occurring. Furthermore, by having some space between the top surfaces 136, 138 and the anti-punch-through layers 1021, 104a (i.e., the distance between lines 103 and 107) the anti-punch-through layer is able to work more effectively while still reducing the chances of latch-up. In other words, if the surfaces 136, 138 were too close to the anti-punch-through layers 102a, 104a, then the benefits of reducing latch-up would be reduced because the higher dopant concentration of the anti-punch-through layers 102a, 104a would be partially diffused into the semiconductor substrate near the top surfaces 136, 138. Conversely, if the surfaces 136, 138 are farther away from the anti-punch-through layers 102a, 104a, then they would be too close to the surface 140 (line 111) and the advantages of avoiding latch-up would be reduced.

Figure 3:
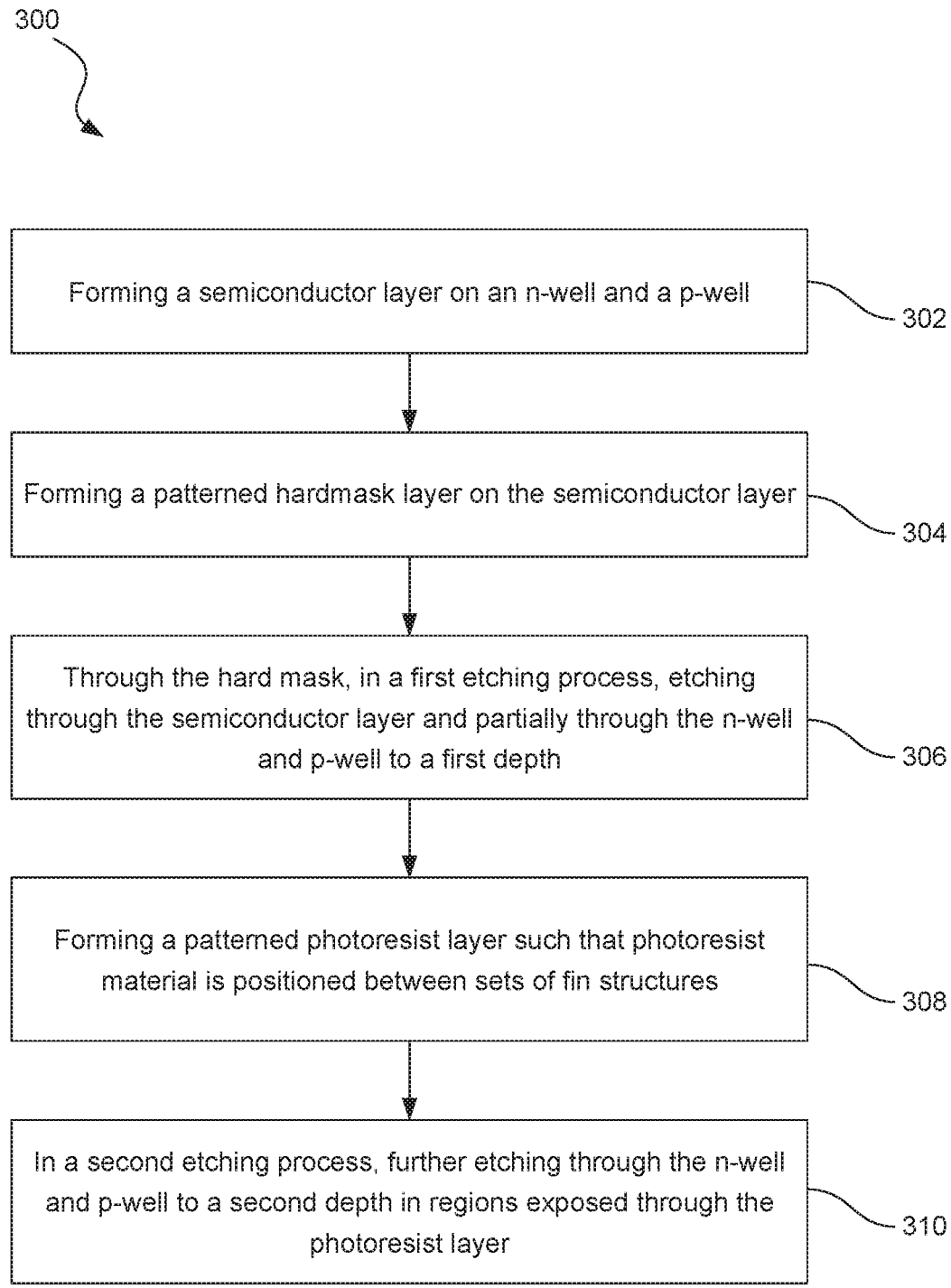
FIG. 3 is a flowchart showing an illustrative method for forming finFET structures with a crown bulk, according to one example of principles described herein.

FIG. 3 is a flowchart showing an illustrative method for forming finFET structures with a crown bulk. According to the present example, the method 300 includes a process 302 for forming a semiconductor layer on an n-well (e.g., 102) and a p-well (e.g., 104). The n-well and p-well may also be referred to as a first region and a second region. As mentioned above, an n-well is doped with an n-type dopant and the p-well is doped with a p-type dopant. Various doping processes may be used such as implanting processes. In one example, to form the n-well and p-well, the first region may be covered with a resist material while the second region is doped. Additionally, the second region may be covered with a resist material while the first region is doped.

The n-well and p-well may each include an anti-punch-through layer (e.g., 102a, 104a) in the upper portions thereof. The anti-punch-through layers have higher doping concentrations of their respective dopant types than the lower portions of the n-well and p-well. The anti-punch-through layers may extend from the top surface of the well regions to a depth of about 20 nanometers, in some examples. Other sizes are contemplated. The anti-punch-through layers may be directly beneath the channel regions which will be formed within the semiconductor layer (e.g., 106).

To form the anti-punch-through layers in the n-well and p-well regions, an implanting process can be used. The implanting process can be tuned such that the anti-punch-through features are formed at a particular depth below the surface of the well regions 102, 104. In one example, the anti-punch-through layers 102a. 104a are formed at a depth such that a bottom of the anti-punch-through layers 102a, 104a are at about 15-25 nanometers below the surface. This can be done by adjusting the electric field used in the ion implanting process. Ion implantation utilizes an electric field to accelerate ions towards a surface. By setting the strength of the electric field appropriately, the ions can lodge near a specific point below the surface. The implanting process implants a n-type dopant but at a higher concentration than the rest of the well regions 102, 104, which are already doped with an n-type dopant. The implanting process is such that the anti-punch-through layer is at a substantially uniform depth. In some examples, a Rapid Thermal Annealing (RTA) process is performed after the implanting process. An RTA process involves exposing the substrate to high temperatures.

The semiconductor layer may be formed through an epitaxial growth process. The epitaxial growth process is used to form crystal structures on underlying crystal structures. In this case, the semiconductor layer is grown onto the doped well regions. The semiconductor layer may be, for example, a silicon layer. Other semiconductor materials may be used as well. In some examples, the top 8-12 angstroms of the silicon layer may be formed in a separate epitaxial process. In other words, the first portion of the semiconductor layer may be formed in a first epitaxial process, and the last 8-12 angstroms of the semiconductor layer may be formed in a second, separate epitaxial process. This may be done to help control etching during subsequent steps.

According to the present example, the method 300 further includes a process 304 for forming a patterned hardmask layer (e.g., 108) on the semiconductor layer. The hardmask layer may be deposited on the semiconductor layer. The hardmask layer 108 may be used to pattern the semiconductor layer as well as the well layers 102, 104 to form fin structures (e.g., 118a, 118b, 118c, 118d). The hardmask layer may include at least one of silicon oxide (SiO2), silicon nitride (SiN), silicon carbide (SiC), silicon oxynitride (SiON), silicon oxycarbide (SiOCN), hafnium oxide (HfO2), aluminum oxide (Al2O3), and zirconium oxide (ZrO2). Other materials are contemplated. In some examples, the hardmask layer may include several sublayers. For example, the hardmask layer may include a first oxide layer approximately 20-30 angstroms thick. On top of that, there may be a silicon nitride layer approximately 200-300 angstroms thick. On top of that, there may be another oxide layer approximately 400-500 angstroms thick. The hardmask layer may be patterned using a photolithographic process. For example, a photoresist may be placed on top of the hardmask layer. The photoresist may be exposed to a light source through a photomask. The photoresist may then be developed such that the portions of the photoresist other than where fin structures are to be formed are removed.

According to the present example, the method 300 further includes a process 306 for, through the hard mask, in a first etching process (e.g., 116), etching through the semiconductor layer and partially through the n-well and p-well to a first depth (e.g., 107). The etching process may be an anisotropic etching process such as a dry etching process. The etching process transfers the pattern of the patterned hardmask layer to the semiconductor layer and the well regions. Thus, the etching process forms a pair of fin structures (e.g., 118a, 118b) in the n-well region and forms a pair of fin structures (e.g., 118c, 118d) in the p-well region. The etching process etches fully through the semiconductor layer and partially through the well regions. The etching process may be controlled to etch the well regions to a depth (e.g., 109) that is twice the depth of the anti-punch-through layers. In some examples, the etching process may etch to a depth of about 40 nanometers. The etching process may be a dry etching process.

According to one example, the method 300 further includes a process 308 for forming a patterned photoresist layer such that photoresist material (e.g., 126) is positioned between sets of fin structures. The photoresist layer may be initially placed on the workpiece through a spin coating process. After the spin coating process, the photoresist layer exists as a single, continuous layer across the semiconductor wafer. Then, the photoresist layer is exposed to a light source through a photomask. After the exposure, the photoresist is developed. After development, the photoresist layer becomes a patterned photoresist layer 126 that covers the space between fin structure 118a and 118b as well as the space between fin structure 118c and 118d. However, the space between those pairs of fin structures is exposed. Specifically, the space above the junction between the n-well and the p-well is exposed.

According to the present example, the method 300 further includes a process 310 for, in a second etching process (e.g., 128), further etching through the n-well and p-well to a second depth (e.g., 111) in regions exposed through the photoresist layer. This second etching process may be, for example, an anisotropic process such as a dry etching process. The etching process may remove n-well and p-well regions to a particular depth. The etching process 128 may remove approximately half as much of the n-well and p-well regions as the previous etching process 116 removed. For example, the etching process may remove approximately 15-25 nanometers worth of material. The etching process may be a dry etching process.

In some examples, after the second etching process, the photoresist layer may be removed. After the patterned photoresist layer 126 is removed, subsequent fabrication steps may be performed to build the transistor on the fin structure. Specifically, a dummy gate may be formed over the fin structures in both the n-well and p-well regions. Source/drain regions may then be formed within the fin structure on both sides of the dummy gate. The dummy gate may then be replaced with a metal gate. In some examples, an isolation structure may be formed around the fin structures. The isolation structure may include, for example, an Interlayer Dielectric Layer (ILD) or a Shallow Trench Isolation (STI) structure. Either the ILD or the STI may include a low-k dielectric material. For example, the isolation structure may include one of silicon nitride (SiN), silicon carbon nitride (SiCN), or silicon oxycarbide (SiOCN). Other materials may be used as well.

By using principles described herein, finFET structures can be improved. For example, the diffusion area within the crown bulk may be reduced. Additionally, there is less leakage current between finFET devices. This reduces the likelihood that a latch-up will occur. And, the well resistance may be lowered as well, which can also reduce the likelihood of a latch-up. Both the leakage current and the well resistance may be reduced by 1 order of magnitude.

According to one example, a semiconductor device includes a first structure having a first fin structure, a second fin structure wherein bottom portions of the first fin structure and the second fin structure are doped with an n-type dopant, and a first semiconductor surface extending between the first fin structure and the second fin structure. The device further includes a second structure having a third fin structure, a fourth fin structure wherein bottom portions of the third and fourth fin structures are doped with a p-type dopant, and a second semiconductor surface extending between the third structure and the fourth structure. The device further includes a third semiconductor surface extending between the first structure and the second structure, the third semiconductor surface being at a lower level than the first and second semiconductor surfaces.

A device includes a semiconductor substrate having a first region and a second region. The device further includes a first pair of fin structures within the first region. The device further includes a second pair of fin structures within the second region. A top surface of the semiconductor surface between fin structures within the first pair is higher than a top surface of the semiconductor surface between the first pair and the second pair.

A method includes forming a semiconductor layer on an n-well and a p-well, forming a patterned hardmask layer on the semiconductor layer, through the hard mask, in a first etching process, etching through the semiconductor layer and partially through the n-well and p-well to a first depth, forming a patterned photoresist layer such that photoresist material is positioned between sets of fin structures, and in a second etching process, further etching through the n-well and p-well to a second depth in regions exposed through the photoresist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first structure comprising:
      a first fin structure;
      a second fin structure, wherein bottom portions of the first fin structure and the second fin structure are doped with an n-type dopant; and
      a first semiconductor surface extending between the first fin structure and the second fin structure;
   a second structure comprising:
      a third fin structure;
      a fourth fin structure, wherein bottom portions of the third and fourth fin structures are doped with a p-type dopant; and
      a second semiconductor surface extending between the third structure and the fourth structure;
   anti-punch-through layers in top ends of the bottom portions of the first, second, third, and fourth fin structures, the first and second semiconductor surfaces being at a lower level than a bottommost portion of the anti-punch-through layers;
   a first epitaxial feature atop the anti-punch-through layers, wherein a bottom surface of the first epitaxial feature directly interfaces a top surface of the anti-punch-through layers in the first and second fin structures;
   a second epitaxial feature atop the anti-punch-through layers, wherein a bottom surface of the second epitaxial feature directly interfaces a top surface of the anti-punch-through layers in the third and fourth fin structures; and
   a third semiconductor surface extending between the first structure and the second structure, the third semiconductor surface being at a lower level than the first and second semiconductor surfaces.

2. The semiconductor device of claim 1, further comprising, source/drain regions formed within top portions of the first, second, third, and fourth fin structures.

3. The semiconductor device of claim 1, wherein a distance between the first semiconductor surface and the third semiconductor surface is about ⅓ of a distance between the third semiconductor surface and a top end of the bottom portions of the first and second fin structures.

4. The semiconductor device of claim 1, wherein the anti-punch through layers are approximately 15-25 nanometers in thickness.

5. The semiconductor device of claim 1, wherein a distance between a top surface of the anti-punch-through layers and the first semiconductor surface is about twice of a thickness of the anti-punch-through layers.

6. The semiconductor device of claim 5, wherein a distance between the anti-punch-through layers and the first semiconductor surface is about 15-25 nanometers.

7. The semiconductor device of claim 1, wherein a distance between the second semiconductor surface and the third semiconductor surface is about ⅓ of a distance between the third semiconductor surface and a top end of the bottom portions of the first and second fin structures.

8. The semiconductor device of claim 1, wherein between the first semiconductor surface and the third semiconductor surface the first structure has a base structure, from which the first and second fin structures protrude, and wherein a sidewall of the base structure aligns with a sidewall of the first fin structure.

9. The semiconductor device of claim 1, wherein the first epitaxial feature extending from a first position directly above the first fin structure to a position directly above the second fin structure, and wherein the second epitaxial feature extending from a third position directly above the third fin structure to a position directly above the fourth fin structure.

10. A device comprising:
a semiconductor substrate having a first region and a second region;
a first pair of fin structures within the first region;
a second pair of fin structures within the second region;
an anti-punch-through layer formed within the fin structures of the first pair and the fin structures of the second pair; and
an epitaxial feature atop the anti-punch-through layer, wherein a bottom surface of the epitaxial feature directly interfaces a top surface of the anti-punch-through layer, wherein a top surface of the semiconductor substrate has a first portion on a first side of the first pair that is between the first pair and the second pair and a second portion on a second side of the first pair that is opposing the first side, wherein a top surface of a semiconductor surface between fin structures within the first pair is higher than the first portion and the second portion of the top surface of the semiconductor substrate and lower than a bottommost portion of the anti-punch-through layer.

11. The device of claim 10, wherein the first region comprises an n-well.

12. The device of claim 10, wherein the second region comprises a p-well.

13. The device of claim 10, wherein the anti-punch-through layer comprises a higher doping concentration than the first region and the second region.

14. The device of claim 10, wherein a thickness of the anti-punch-through layer is about 15-25 nanometers.

15. The device of claim 10, wherein a distance between the top surface of the semiconductor surface between fin structures within the first pair and the first portion of the top surface of the semiconductor substrate between the first pair and the second pair is about 15-25 nanometers.

16. The device of claim 10, wherein a distance between the top surface of the semiconductor surface between fin structures within the first pair and the top surface of the semiconductor surface between the first pair and the second pair is about ⅓ of a distance between the first portion of the top surface of the semiconductor substrate between the first pair and the second pair and a channel portion of the fin structures.

17. The device of claim 10, wherein the anti-punch-through layer has a substantially flat bottom surface.

18. A semiconductor device comprising:
a first structure comprising:
a first fin structure;
a second fin structure; and
a first semiconductor surface extending between the first fin structure and the second fin structure;
a second structure comprising:
a third fin structure;
a fourth fin structure; and
a second semiconductor surface extending between the third structure and the fourth structure;
anti-punch-through layers in top ends of bottom portions of the first, second, third, and fourth fin structures; and
a third semiconductor surface extending between the first structure and the second structure, the third semiconductor surface being at a lower level than the first and second semiconductor surfaces,
wherein between the first semiconductor surface and the third semiconductor surface the first structure has a first base structure, from which the first and second fin structures protrude, and wherein a first sidewall of the first base structure aligns with a sidewall of the first fin structure and a second sidewall of the first base structure aligns with a sidewall of the second fin structure.

19. The semiconductor device of claim 18, wherein between the first semiconductor surface and the third semiconductor surface the second structure has a second base structure, from which the third and fourth fin structures protrude, and wherein a first sidewall of the second base structure aligns with a sidewall of the fourth fin structure and a second sidewall of the second base structure aligns with a sidewall of the third fin structure.

20. The semiconductor device of claim 18, further comprising:
a fourth semiconductor surface, wherein the third semiconductor surface directly interfaces the second sidewall of the first base structure and the fourth semiconductor surface directly interfaces the first sidewall of the first base structure, and wherein the fourth semiconductor surface being at a lower level than the first and second semiconductor surfaces.

* * * * *